US012521924B2

(12) United States Patent
Hirano et al.

(10) Patent No.: US 12,521,924 B2
(45) Date of Patent: Jan. 13, 2026

(54) MOLDING METHOD

(71) Applicant: THE JAPAN STEEL WORKS, LTD., Tokyo (JP)

(72) Inventors: Takayuki Hirano, Tokyo (JP); Kazuma Hamada, Tokyo (JP); Kenichi Furuki, Tokyo (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 0 days.

(21) Appl. No.: 17/388,709

(22) Filed: Jul. 29, 2021

(65) Prior Publication Data

US 2022/0032516 A1    Feb. 3, 2022

(30) Foreign Application Priority Data

Jul. 31, 2020 (JP) ................. 2020-130123

(51) Int. Cl.
*B29C 45/14* (2006.01)
*B29L 31/34* (2006.01)

(52) U.S. Cl.
CPC .... *B29C 45/14467* (2013.01); *B29C 45/1418* (2013.01); *B29C 45/14639* (2013.01); *B29L 2031/3425* (2013.01)

(58) Field of Classification Search
CPC .......... B29C 45/14467; B29C 45/1418; B29C 45/14639
See application file for complete search history.

(56) References Cited

U.S. PATENT DOCUMENTS 3,039,177 A * 6/1962 Burdett .................. H05K 3/205
439/85
4,470,786 A * 9/1984 Sano ................. B29C 45/14073
425/149
4,944,087 A * 7/1990 Landi ................ B29C 45/14827
29/846

(Continued)

FOREIGN PATENT DOCUMENTS

CH           691020      *  3/2001
DE         19506159      *  8/1995

(Continued)

OTHER PUBLICATIONS

"Free Form Electronics (F2E): Freedom in design by thermo-formed printed electronics", JFlex 2020 exhibition brochure, JFlex2020 at Tokyo Big Sight, Jan. 29-31, 2020.

(Continued)

*Primary Examiner* — Edmund H Lee
(74) *Attorney, Agent, or Firm* — Potomac Law Group, PLLC

(57) ABSTRACT

A molding method integrally molds thermoplastic resin and a flexible substrate mounted with a circuit and an electronic component on a flat plate having flexibility into a three-dimensional shape. The molding method includes the steps of determining an unfolded shape and circuit arrangement of the flexible substrate corresponding to the three-dimensional shape, elastically deforming and holding the flexible substrate along a resin filling space of a mold while the mold is being opened, and closing the mold and filling the resin filling space with thermoplastic resin.

15 Claims, 16 Drawing Sheets

(56) References Cited

U.S. PATENT DOCUMENTS

| | | | | |
|---|---|---|---|---|
| 4,944,908 | A * | 7/1990 | Leveque | B29C 45/14639 216/36 |
| 5,090,122 | A * | 2/1992 | Kitagawa | H05K 3/207 29/852 |
| 5,233,753 | A * | 8/1993 | Wolf | H05K 3/0014 29/846 |
| 5,639,403 | A * | 6/1997 | Ida | B29C 45/77 264/272.17 |
| 5,738,797 | A * | 4/1998 | Belke, Jr. | H05K 3/205 216/16 |
| 6,849,225 | B1 * | 2/2005 | Gilbert | B29C 45/14196 425/DIG. 58 |
| 7,070,724 | B2 * | 7/2006 | Nakazawa | B29C 45/062 264/328.8 |
| 7,401,758 | B2 * | 7/2008 | Liang | B29C 43/18 264/271.1 |
| 7,676,918 | B2 * | 3/2010 | Chang | H05K 3/0014 29/841 |
| 9,873,330 | B2 * | 1/2018 | Atsumi | B60J 7/043 |
| 10,315,345 | B2 * | 6/2019 | Belforte | B60R 13/0256 |
| 10,575,407 | B2 * | 2/2020 | Heikkinen | H05K 1/0393 |
| 2006/0175733 | A1 * | 8/2006 | Ju | B29C 45/14639 264/272.11 |
| 2008/0012154 | A1 * | 1/2008 | Chang | H05K 3/0014 257/E23.038 |
| 2008/0257706 | A1 * | 10/2008 | Haag | B29C 45/14655 200/600 |
| 2014/0043772 | A1 * | 2/2014 | Isoda | H05K 13/04 361/728 |
| 2016/0309595 | A1 * | 10/2016 | Heikkinen | B29C 45/14639 |

FOREIGN PATENT DOCUMENTS

| | | | |
|---|---|---|---|
| JP | S63-284888 A | | 11/1988 |
| JP | 01167923 | * | 7/1989 |
| JP | 05037132 | * | 2/1993 |
| JP | 5190994 | * | 7/1993 |
| JP | H06-238709 A | | 8/1994 |
| JP | H06238708 | * | 8/1994 |
| JP | H07-106733 A | | 4/1995 |
| JP | H7122825 | * | 5/1995 |
| JP | 8267504 | * | 10/1996 |
| JP | 2004-058442 A | | 2/2004 |
| JP | 2005268519 | * | 9/2005 |
| JP | 2009-152507 A | | 7/2009 |
| JP | 2009-529471 A | | 8/2009 |
| JP | 2014-013930 A | | 1/2014 |
| JP | 2020-516487 A | | 6/2020 |
| WO | WO9609155 | * | 3/1996 |
| WO | 2007/106367 A2 | | 9/2007 |
| WO | 2014/041470 A2 | | 3/2014 |
| WO | 2018/189418 A1 | | 10/2018 |

OTHER PUBLICATIONS

Certificate to Apply the Provisions of the Exception to Loss of Novelty of Invention, submitted in Japanese Patent Application No. 2020-130123 filed Jul. 31, 2020.

Furuki, Kenichi, "Jflex Display Samples Reaction Report," Mar. 5, 2020.

Office Action issued Feb. 6, 2024, in Japanese Patent Application No. 2020-130123.

Decision to Grant issued Jun. 25, 2024, in Japanese Patent Application No. 2020-130123.

* cited by examiner

MOLDING METHOD

INCORPORATION BY REFERENCE

This application is based upon and claims the benefit of priority from Japanese patent application No. 2020-130123, filed on Jul. 31, 2020, the disclosure of which is incorporated herein in its entirety by reference.

BACKGROUND

The present disclosure relates to a molding method and a molding system.

Insert molding for integrally molding a circuit board mounted with an electronic component and resin is known. For example, in the technique disclosed in Japanese Unexamined Patent Application Publication No. 2004-058442, a pin protruding in a cavity holds an electronic substrate while a mold is being closed, and an injection molding apparatus primarily injects resin in the cavity. Then, when the primarily-injected resin is solidified to some extent to be able to hold the electronic substrate, the pin is retracted, and the injection molding apparatus secondarily injects resin.

SUMMARY

However, there has been no technique of insert-molding a flexible substrate including an electronic component into a three-dimensional shape.

Other problems and novel features will be made apparent from the following description and the accompanying drawings.

A molding method according to one embodiment integrally molds thermoplastic resin and a flexible substrate mounted with a circuit and an electronic component on a flat plate having flexibility into a three-dimensional shape.

The molding method includes the steps of:
- (a) preparing the flexible substrate having an unfolded shape and circuit arrangement corresponding to the three-dimensional shape;
- (b) elastically deforming the flexible substrate and holding the flexible substrate along a resin filling space of a mold while the mold is being opened; and
- (c) closing the mold and filling the resin filling space with thermoplastic resin.

A molding system according to one embodiment configured to integrally mold thermoplastic resin and a flexible substrate mounted with a circuit and an electronic component on a flat plate having flexibility into a three-dimensional shape, the molding system includes a substrate holding device and an injection molding apparatus. The substrate holding device holds the flexible substrate along a resin filling space of a mold while the mold is being opened. The injection molding apparatus closes the mold and fills the resin filling space with thermoplastic resin.

According to the one embodiment, it is possible to provide an insert molding method and a molding system that integrally mold resin and a flexible substrate including an electronic component into a three-dimensional shape.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

Figure 1:
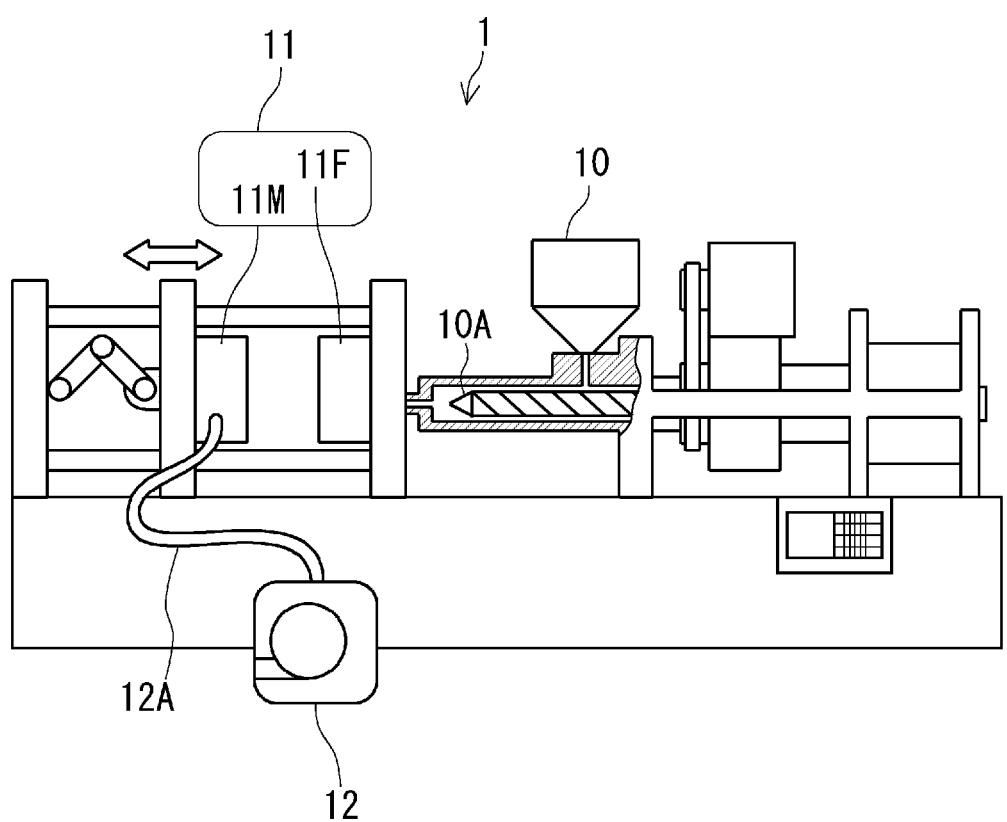
FIG. 1 is an overview diagram showing a molding system according to an embodiment.

As related studies, the inventors of the present application have disclosed a literature "Free Form Electronics (F2E): Freedom in design by thermo-formed printed electronics" and a presentation regarding "Method of integrally molding a flexible substrate and resin into a three-dimensional shape", JFlex2020 at Tokyo Big Sight, Jan. 29-30, 2020, prior to the present application (see Non-Patent literature 1). The provision for "exceptions to lack of novelty of invention" should be applied to the optical modulator reported on in the presentation. Herein after, the present invention will be described through embodiments. However, the inventions in the Claims are not limited to the following embodiments. Moreover, not all of the configurations described in the embodiments are indispensable as means for solving the problem. Note that an embodiment of the present disclosure will be described hereinafter, the description will not limit the Claims For clarifying the explanation, the following description and the drawings are partially omitted and simplified as appropriate. The same reference numerals (or symbols) are assigned to the same elements throughout the drawings and redundant explanations thereof are omitted as appropriate.

Embodiment

Hereinafter, an embodiment of the present disclosure will be described with reference to the drawings. FIG. 1 is an overview diagram showing a molding system according to the embodiment. A molding system 1 shown in FIG. 1 is a molding system that integrally molds thermoplastic resin and a flexible substrate including an electronic component into a three-dimensional shape.

In the present embodiment, "to integrally mold" means to integrally mold a flexible substrate and resin by insert molding. In addition, "insert molding" in the present embodiment means that resin is injected into a mold after a flexible substrate is installed in the mold to manufacture a composite product obtained by integrating the flexible substrate and the resin. In addition, a "flexible substrate" in the present embodiment means a flat-plate-like film having flexibility on which a circuit and an electronic component are mounted. In the following description, "thermoplastic resin" can be simply referred to as "resin".

In the following, an outline of a configuration of the molding system 1 is described. The molding system 1 mainly includes an injection molding apparatus 10, a mold 11, and a suction device 12.

The injection molding apparatus 10 fixes a stationary mold 11F of the mold 11 and holds a movable mold 11M of the mold 11 in such a manner as to be advanced and retracted. The injection molding apparatus 10 injects plasticized resin into the mold 11 using a screw 10A of the injection molding apparatus 10 while the mold 11 is being closed. When the injected resin is solidified, the injection molding apparatus 10 opens the mold 11 in order to take out the solidified resin molding. Note that, a part of the injection molding apparatus 10 is shown as a cross section in FIG. 1, and the screw 10A of the injection molding apparatus 10 is shown in the cross section.

The mold 11 is constituted by the stationary mold 11F and the movable mold 11M. While the stationary mold 11F and the movable mold 11M are being closed, a resin filling space is formed inside the mold 11. The resin filling space, in which a flexible substrate described later is installed, is filled with thermoplastic resin injected from the injection molding apparatus 10.

The suction device 12 is an implementation of a substrate holding device that holds a flexible substrate in the mold 11. The suction device 12 includes a vacuum pump and sucks air from a hole provided in the movable mold 11M through a pipe 12A connected with the hole of the movable mold 11M. Accordingly, the suction device 12 sucks air through a hole provided on a face exposed to the resin filling space in the mold 11. Then, the suction device 12 holds a flexible substrate 120 by sucking the flexible substrate installed in such a manner as to cover the hole.

The above molding system 1 installs and holds a flexible substrate including an electronic component in the movable mold 11M, closes the mold 11 while holding the flexible substrate, and injects resin into the closed mold 11. Accordingly, the molding system 1 can integrally mold the flexible substrate and the resin into a three-dimensional shape.

Figure 2:
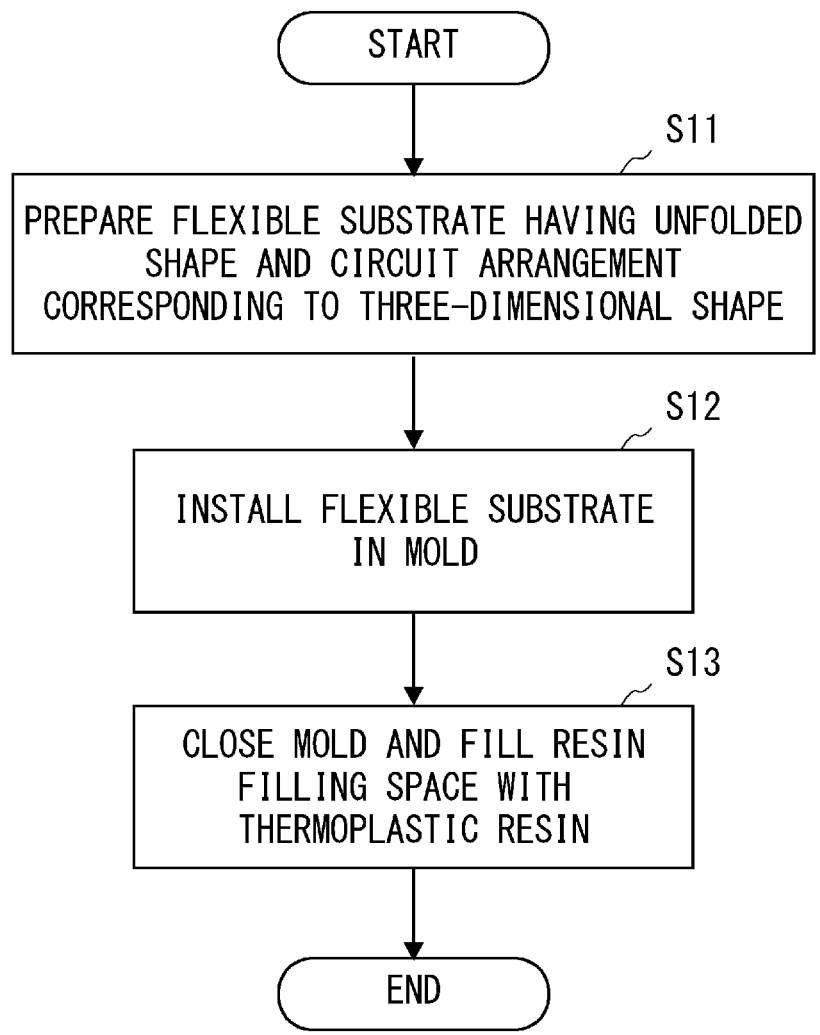
FIG. 2 is a flowchart of a molding method according to the embodiment.

Next, a molding method performed using the molding system 1 is described with reference to FIG. 2. FIG. 2 is a flowchart of a molding method according to the embodiment. The flowchart shown in FIG. 2 is a method for a user using the molding system 1 to manufacture a desired molding. Note that, in order to start the flowchart shown in FIG. 2, it is assumed that a three-dimensional shape of a molding has been determined.

First, the user prepares a flexible substrate having an unfolded shape and circuit arrangement corresponding to the three-dimensional shape (step S11). More specifically, the user determines, from the three-dimensional shape of the molding, the unfolded shape of the flexible substrate and determines a circuit pattern and arrangement of an electronic component in the determined unfolded shape.

At this time, the user may provide, as the unfolded shape, a notch portion having a V-shape, U-shape, or another shape to the flexible substrate. In addition, the user may provide a slit to the flexible substrate in such a manner that the three-dimensional shape includes a notch portion having a V-shape, a U-shape, or another shape. By providing the notch portion or the slit, the molding method according to the present embodiment can relax the stress applied to the flexible substrate when the three-dimensional shape is formed.

In addition, in order to prepare a flexible substrate, the user divides the flexible substrate into an area receiving relatively large mechanical loads and an area not receiving relatively large mechanical loads when determining a circuit pattern and arrangement of an electronic component. Then, the user arranges the electronic component in the area not receiving relatively large mechanical loads.

More specifically, the user may set, for example, an area in which the flexible substrate has equal to or greater than a preset curvature radius as a first area and set an area in which the flexible substrate has less than the preset curvature radius as a second area. In this case, the user determines to arrange the electronic component in the first area.

Alternatively, the user may set, for example, an area in which the flexible substrate receives stress having less than a preset threshold as a first area and set an area in which the flexible substrate receives stress of equal to or greater than the preset threshold as a second area to determine to arrange the electronic component in the first area.

Next, the user elastically deforms and holds the prepared flexible substrate along the mold 11 while the mold 11 is being opened (step S12). That is, the user installs the flexible substrate on the movable mold 11M of the mold 11 and operates the suction device 12 to cause the movable mold 11M to hold the flexible substrate.

Next, the user operates the injection molding apparatus 10 to close the mold 11 and fill the resin filling space with thermoplastic resin (step S13). The injection molding apparatus 10 fills the mold with resin and cools the resin with which the mold is filled, whereby the injection molding apparatus 10 integrally molds the flexible substrate and the resin. Accordingly, the user can manufacture the desired molding.

Figure 3:
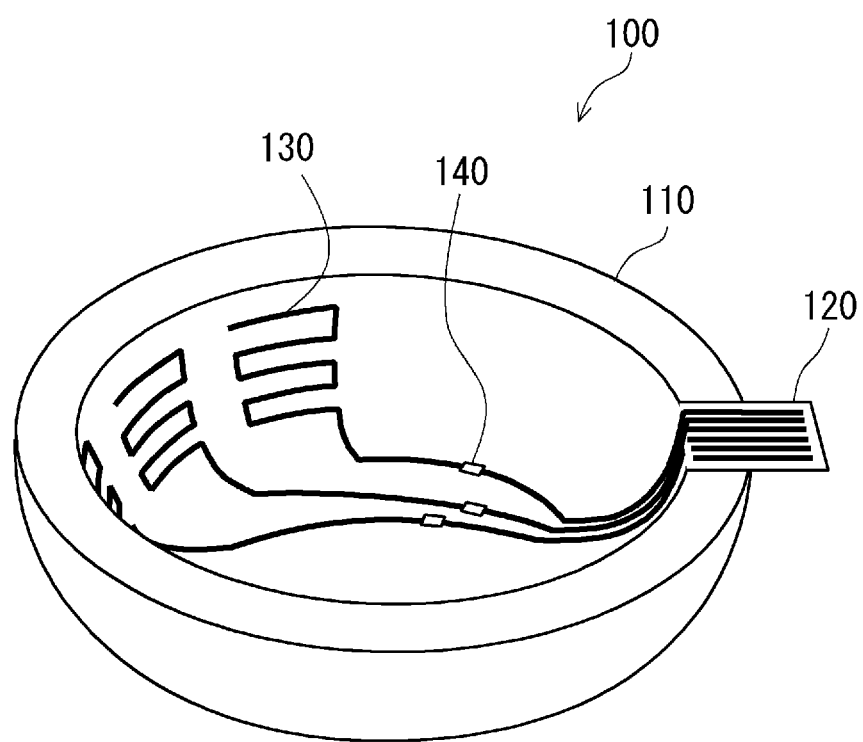
FIG. 3 is a perspective view of a molding according to the embodiment.

Next, the above molding method is more concretely described. FIG. 3 is a perspective view of a molding according to the embodiment. FIG. 3 shows a product 100, which is an example of a molding obtained by integrally molding a flexible substrate and resin. The product 100 shown in FIG. 3 includes a resin portion 110, a flexible substrate 120, a wiring portion 130, and an electronic component 140. That is, the product 100 is one obtained by integrally molding the flexible substrate 120 and resin. Note that, in the product 100, by welding the resin material and the material of the flexible substrate during, for example, molding of the resin, the resin portion 110 and the flexible substrate 120 are not separated but integrated. Alternatively, in the product 100, the resin portion 110 and the flexible substrate 120 are integrated via an adhesion layer provided on a contact face therebetween.

The product 100 shown in FIG. 3 is predetermined to have a bowl-type three-dimensional shape and include a connector portion on the edge of the bowl and crank-like shaped wiring on a side face portion formed as a curved surface. The product 100 is further predetermined to be mounted with the electronic component 140 on a point of the wiring. Meanwhile, in the product 100, the shape of the flexible substrate 120, the wiring pattern from the connector portion to the crank-like shaped wiring, and the arrangement of the electronic component 140 are undetermined. Thus, in order to manufacture the product 100, the user determines the shape of the flexible substrate 120, the wiring pattern from the connector portion to the crank-like shaped wiring, and the arrangement of the electronic component 140 to prepare the flexible substrate.

Figure 4:
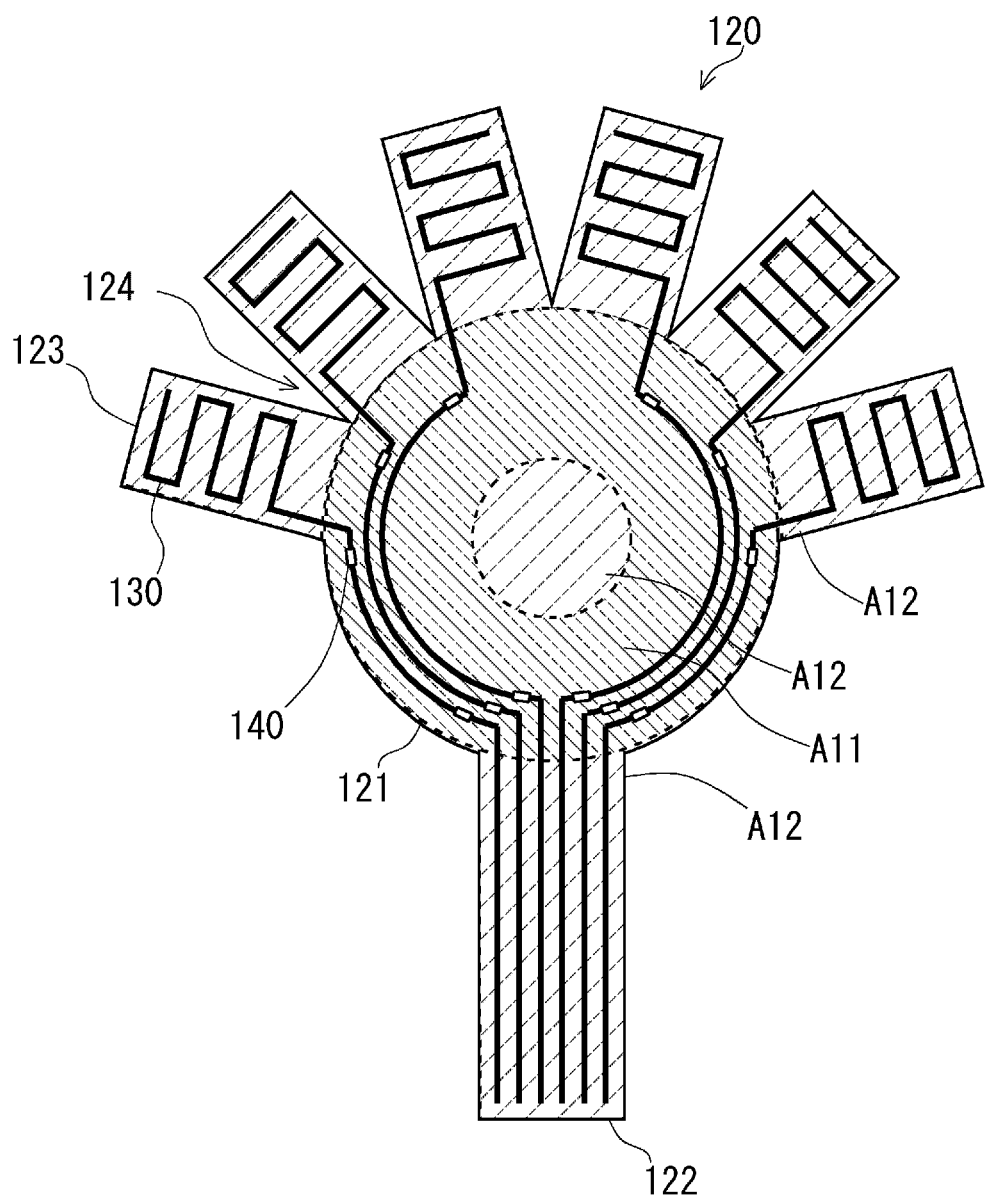
FIG. 4 is an exploded view of a flexible substrate according to the embodiment.

Next, the flexible substrate 120 is described with reference to FIG. 4. FIG. 4 is an exploded view of the flexible substrate 120 according to the embodiment. FIG. 4 shows that the flexible substrate 120 is observed from a direction parallel to an axis orthogonal to the main face of the flexible substrate 120. The flexible substrate 120 includes a flat-plate-like base film 121 having flexibility as a base substrate and is mounted with the wiring portion 130 and the electronic component 140 on one main face of the base film 121. The base film 121 is constituted by, for example, a polycarbonate, polyimide, or polyester resin plate material.

The base film 121 of the flexible substrate 120 includes a strip-like connector portion 122 extending from a center circular portion to the lower part of the drawing and six strip-like radial-shaped portions 123 extending radially from the upper half of the circular portion. In each space between the adjacent six radial-shaped portions 123, a notch portion 124 that is a V-shaped cut is provided.

In the above shape, the circular portion of the flexible substrate 120 is arranged in the bottom portion of the product 100, and the connector portion 122 and the radial-shaped portions 123 of the flexible substrate 120 are arranged on the bowl-shaped side face portion. The radial-shaped portions 123 are deformed in a direction along the axis orthogonal to the main face of the flexible substrate 120 when being integrally molded as a molding. At this time, the radial-shaped portions 123 are deformed in such a manner that the angle of each notch portion 124 becomes narrower. Accordingly, the flexible substrate 120 can be suitably deformed into the desired three-dimensional shape while relaxing mechanical loads caused by deformation.

Next, the circuit arrangement of the flexible substrate 120 is described. The flexible substrate 120 includes six wires extending from the connector portion 122 to the circular portion, and the wires each extend to the respective radial-shaped portions 123 and form the crank-like pattern. Each of the six wires includes the electronic component 140 at the center circular portion.

Note that, the material used for the wiring portion 130 in the present embodiment has conductivity and a property capable of following the deformation of the base film. The wiring portion 130 is made of, for example, a material containing binder for making silver paste having conductivity flexible. The electronic component 140 is any electronic component, such as a resistor, an LED, a capacitor, an integrated circuit, or a connector. The electronic component 140 is mounted on the circuit by, for example, conductive adhesive, solder, a connector, or the like.

The flexible substrate 120 shown in the drawing includes a first area A11 and a second area A12. The first area A11 is, in the area of the flexible substrate 120, an area on which the electronic component 140 is mountable to manufacture the product 100. The second area A12 is, in the area of the flexible substrate 120, an area possibly causing a problem in quality if the electronic component 140 is mounted thereon to manufacture the product 100.

The first area A11 and the second area A12 are exclusively-defined independent areas. The first area A11 and the second area A12 are set depending on mechanical or thermal loads applied to the flexible substrate 120 in manufacturing the product 100. This setting is made by the user performing analysis. At this time, the user can use various methods, such as simulation by a computer or analysis by a finite element method.

The second area A12 includes an area involving large deformation when, for example, the flexible substrate 120 is installed in the mold 11. The "large deformation" means deformation in which, for example, the curvature radius is less than a preset threshold. In this case, in the circuit arrangement, the user sets, in the area that is elastically deformed, an area having less than a preset curvature radius as the first area A11, sets an area having equal to or greater than the preset curvature radius as the second area A12, and arranges the electronic component 140 in the first area A11.

The second area A12 further includes an area receiving large stress when, for example, the flexible substrate 120 is installed in the mold 11 and integrally molded. The "large stress" means, for example, stress accompanying at least one or more of bending stress, tensile stress, compressive stress, shearing stress, and thermal stress, and is equal to or greater than a preset threshold. In this case, the user sets, in the circuit arrangement, an area in which the flexible substrate receives stress of less than the preset threshold as the first area A11, sets an area in which the flexible substrate receives stress of equal to or greater than the threshold as the second area A12, and arranges the electronic component 140 in the first area A11.

The user makes, in addition to the arrangement of the electronic component, the pattern shape, the wiring width, the wiring thickness, and the like of the wiring portion 130 correspond to the above areas. That is, the user makes the wiring pattern to be mounted in the second area A12 withstand stress larger than the wiring pattern to be mounted in the first area A11 does. As described above, by setting the first area A11 and the second area A12, the molding method according to the present embodiment can prevent the reliability of the product 100 obtained by integrally molding the flexible substrate 120 and resin from being lowered.

The user determines the unfolded shape and the circuit arrangement corresponding to the three-dimensional shape as described above and prepares the flexible substrate 120 in accordance with the determined specification. After preparing the flexible substrate 120, the user proceeds to a molding step, which is the next step, using the flexible substrate 120.

Figure 5:
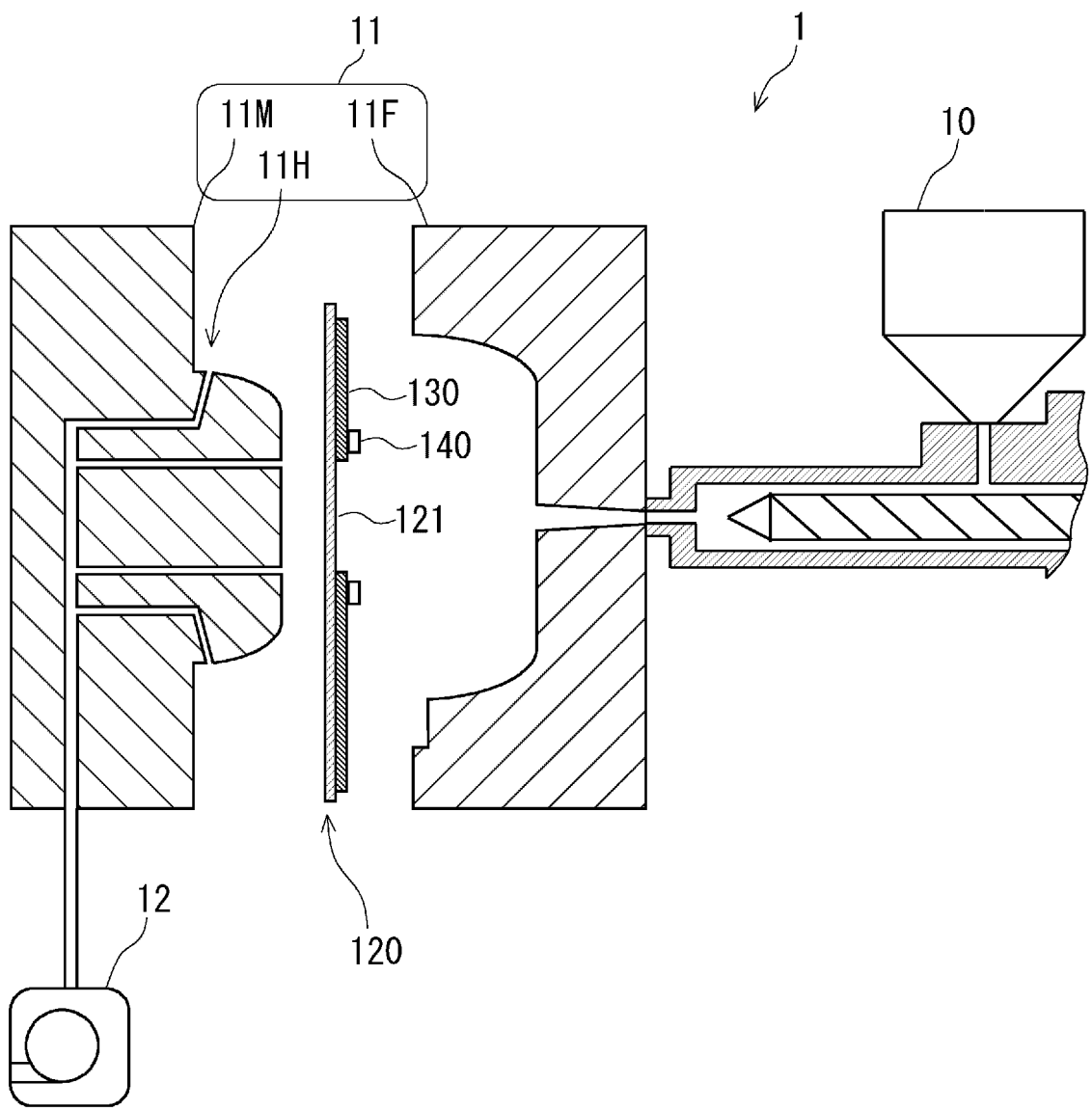
FIG. 5 is a first diagram showing a molding step according to the embodiment.

Next, the molding step is concretely described. FIG. 5 is a first diagram showing the molding step according to the embodiment. FIG. 5 shows the molding system 1 shown in FIG. 1 and the flexible substrate 120. In the injection molding apparatus 10 of the molding system 1 shown in FIG. 5, a hopper accommodating resin pellets and a screw portion that plasticizes a resin pellet and injects resin into the mold alone are schematically shown, and the other parts are omitted. In addition, the cross section of the mold 11 is schematically shown. Furthermore, the suction device 12 connected to the mold is also schematically shown for the sake of easy understanding.

Here, the mold 11 is described. The mold 11 shown in FIG. 5 is being opened, that is, the stationary mold 11F and the movable mold 11M are being separated from each other. The stationary mold 11F of the mold 11 is connected to an injection port of the injection molding apparatus 10 that injects resin, and receives the resin from the injection port. The stationary mold 11F includes a recessed portion. The recessed portion of the stationary mold 11F is a cavity forming the shape of the product 100 and forms the resin filling space between the recessed portion and a protruding portion of the movable mold 11M when the mold 11 is being closed. When the resin filling space of the mold 11 is filled with resin, the bowl-shaped product 100 shown in FIG. 3 is formed.

The movable mold 11M includes a protruding portion and forms the resin filling space between the protruding portion and the recessed portion of the stationary mold 11F when the mold 11 is being closed. In addition, the protruding portion of the movable mold 11M is brought into contact with the flexible substrate 120. In the protruding portion of the movable mold 11M, the area that is brought into contact with the flexible substrate 120 includes a plurality of holes 11H. The holes 11H are merged inside the movable mold 11M and then connected to the suction device 12. Thus, the holes 11H suck air outside the holes 11H when the suction device 12 operates. Note that, the holes 11H may be tube-like or machined to be porous-like.

In the above configuration, the user inserts the flexible substrate 120 between the stationary mold 11F and the movable mold 11M to install the flexible substrate 120 in the mold 11. At this time, the posture of the flexible substrate 120 is that the base film 121 faces the movable mold 11M and that the wiring portion 130 and the electronic component 140 face the stationary mold 11F.

Figure 6:
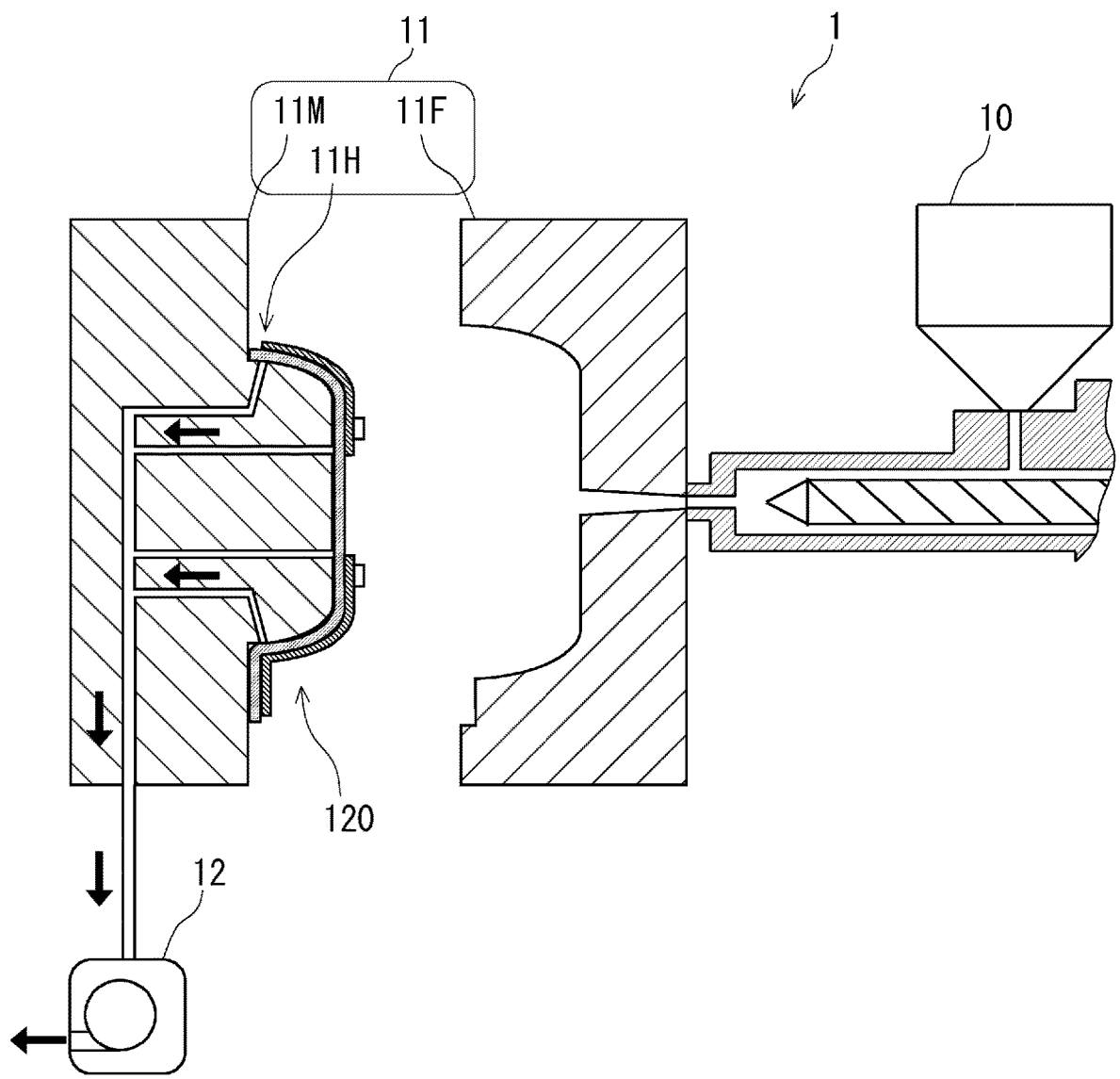
FIG. 6 is a second diagram showing a molding step according to the embodiment.

The next step is described with reference to FIG. 6. FIG. 6 is a second diagram showing a molding step according to the embodiment. After the step shown in FIG. 5, the user installs the flexible substrate 120 along the protruding portion of the movable mold 11M. That is, the user elastically deforms the flexible substrate 120 into the three-dimensional shape along the mold 11 while the mold 11 is being opened. When the flexible substrate 120 is installed along the protruding portion, the holes 11H are covered by the flexible substrate 120. In this state, the suction device 12 is caused to operate. Then, the movable mold 11M holds the flexible substrate 120 by sucking the flexible substrate 120. Note that, the user may perform the steps in FIGS. 5 and 6 with a specific robot, a conveyance device, or the like.

Figure 7:
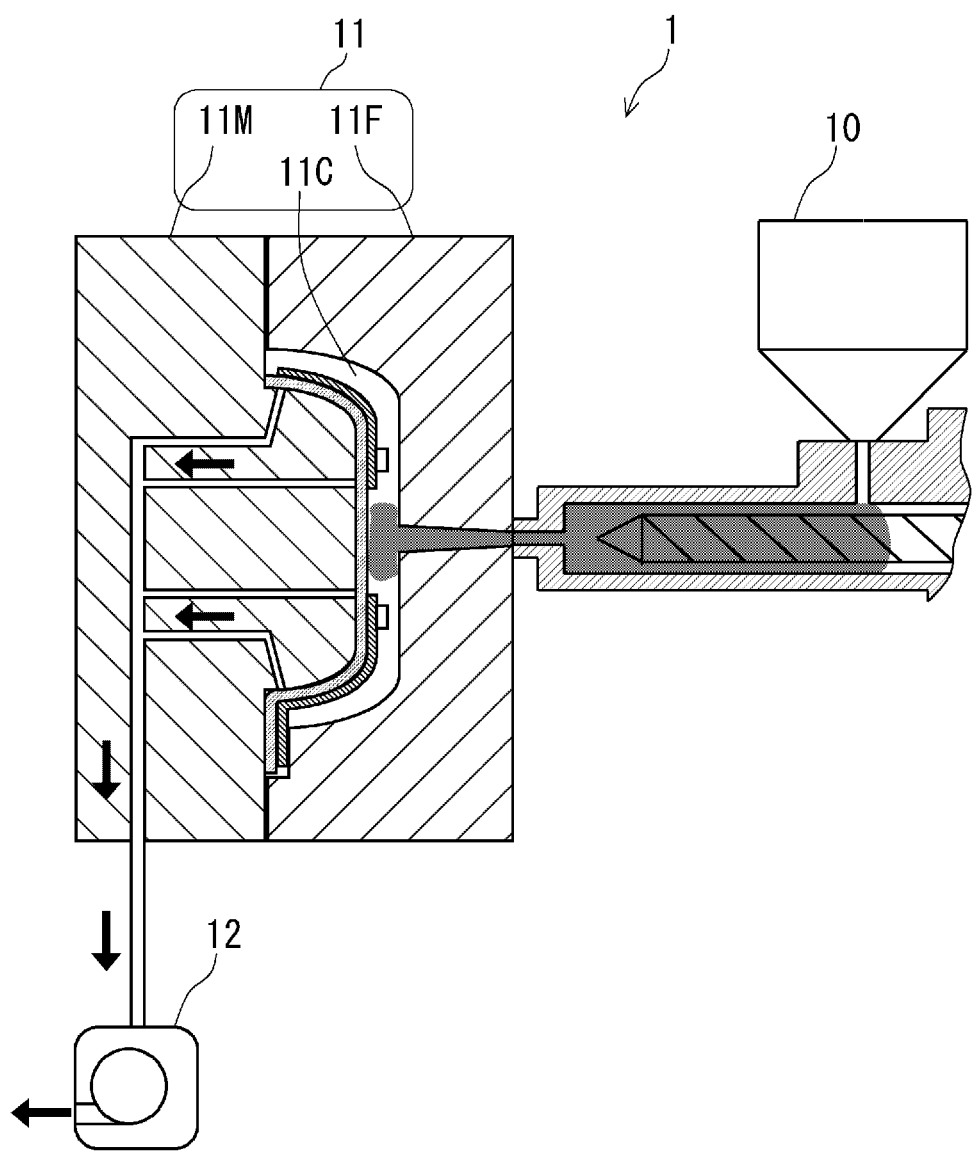
FIG. 7 is a third diagram showing a molding step according to the embodiment.

The next step is described with reference to FIG. 7. FIG. 7 is a third diagram showing a molding step according to the embodiment. FIG. 7 shows that the injection molding apparatus 10 closes the mold while the flexible substrate 120 is being held and that resin is being injected into a resin filling space 11C formed in the closed mold 11.

In the above state, the suction device 12 continues to operate and holds the flexible substrate 120. Note that, when the resin filling space 11C is filled with resin and the resin with which the resin filling space 11C is filled is solidified, the resilience of the flexible substrate 120 that resiles to the flat plate is suppressed by the resin without holding of the suction device 12. Alternatively, the flexible substrate 120 is heated by contact with highly-heated resin and is plastically deformed. Thus, the flexible substrate 120 does not need to be held by the suction device 12. In such a case, the suction device 12 stops operating.

Figure 8:
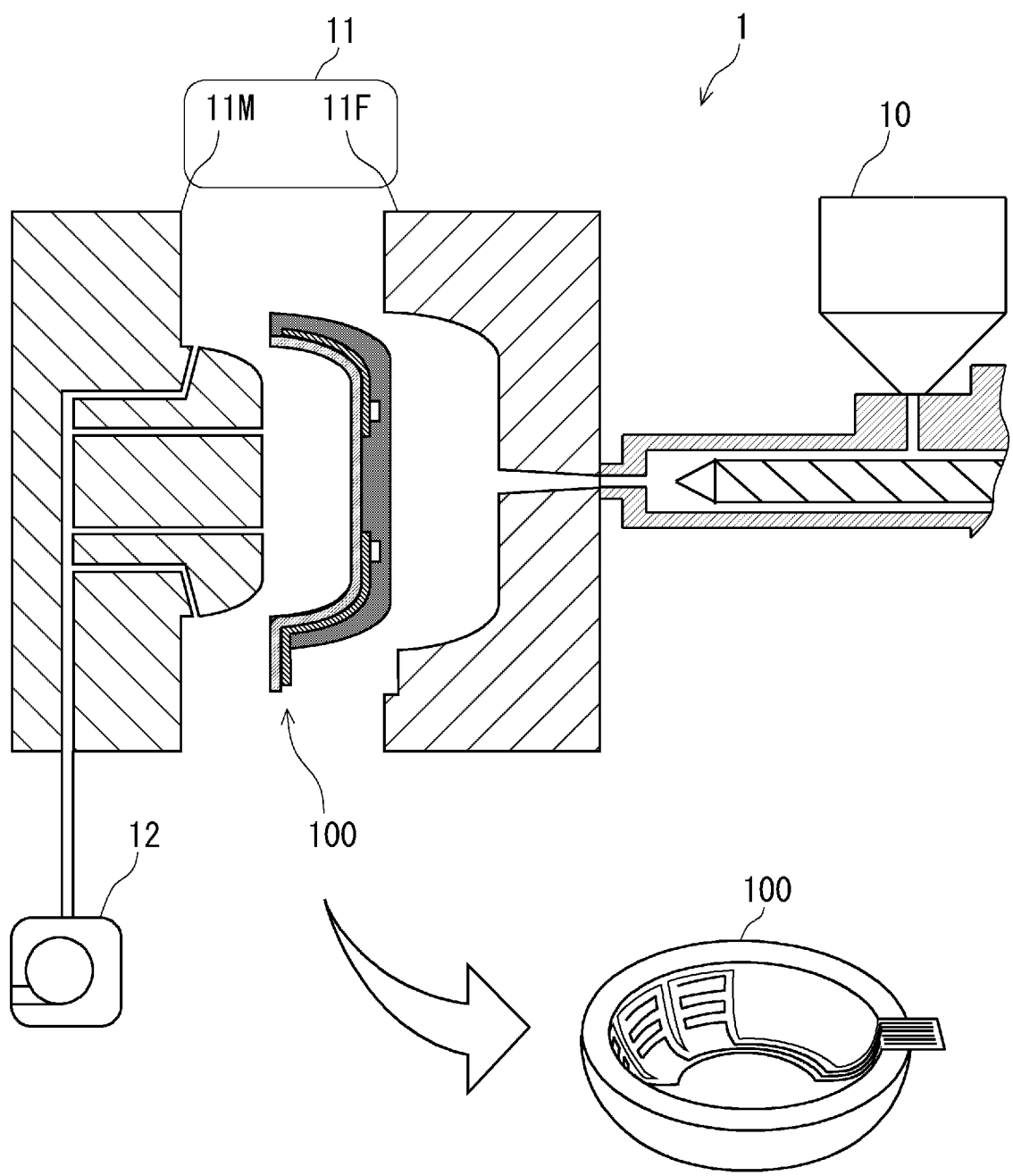
FIG. 8 is a fourth diagram showing a molding step according to the embodiment.

The next step is described with reference to FIG. 8. FIG. 8 is a fourth diagram showing a molding step according to the embodiment. After the resin filling space 11C is filled with resin, the resin with which the resin filling space 11C is filled is cooled to be solidified, and then the injection molding apparatus 10 opens the mold 11. The user takes out, from the opened mold 11, the product 100 obtained by integrally molding the resin and the flexible substrate 120. Note that, the user may perform the step of taking out the product 100 with a specific robot, an extracting device, or the like.

The molding method and the molding system according to the embodiment have been described above. With the above configuration, the molding method according to the embodiment can integrally mold a flexible substrate including an electronic component and resin into a three-dimensional shape.

Figure 9:
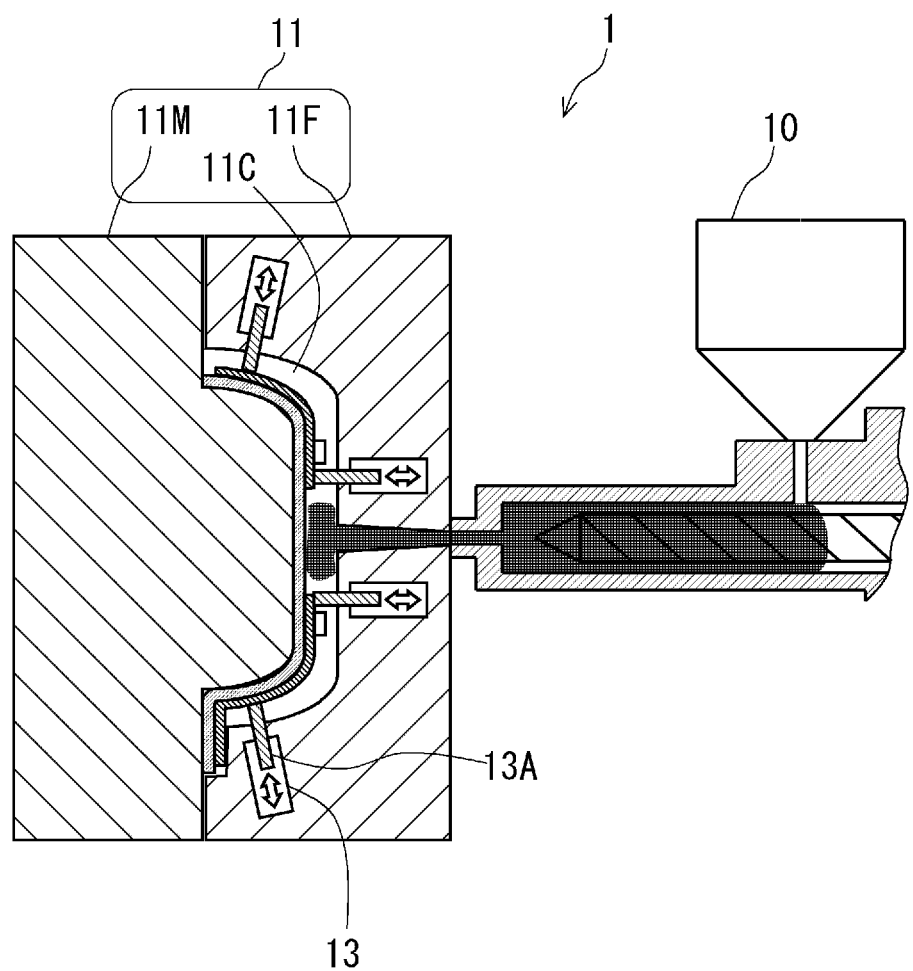
FIG. 9 is a diagram showing a second example of the molding system.

Next, another implementation of the substrate holding device is described with reference to FIG. 9. FIG. 9 is a diagram showing a second example of the molding system. In the mold 11 shown in the drawing, the stationary mold 11F includes a clamping device 13.

The clamping device 13 is configured in such a manner that a plurality of pins 13A buried in the stationary mold 11F is able to protrude in the resin filling space 11C. The clamping device 13 includes an actuator (not shown) to make the pins 13A protrude from the stationary mold 11F or to house the protruding pins. That is, the clamping device 13 makes the pins 13A protrude to clamp the flexible substrate 120 with the pins 13A and the movable mold 11M. Accordingly, the molding system 1 holds the flexible substrate 120.

FIG. 9 shows that the mold 11 is being closed and that the clamping device 13 is clamping the flexible substrate 120. FIG. 9 further shows that the injection molding apparatus 10 is injecting resin while the clamping device 13 is clamping the flexible substrate 120. Here, the clamping device 13 releases the clamping after filling the resin filling space 11C with resin is started and before the filling is completed. With such motions, the clamping device 13 holds the flexible substrate 120 and houses the pins 13A before the resin filling space 11C is completely filled with resin, whereby it is possible to mold resin into a desired shape.

Note that, if the clamping device 13 is employed, the flexible substrate 120 needs to be held while the mold 11 is being opened. In this case, the suction device 12 may be also employed, for example. Alternatively, instead of the suction device 12, pressure sensitive adhesive may be used to temporarily fix the flexible substrate 120 on the face in contact with the movable mold 11M.

Figure 10:
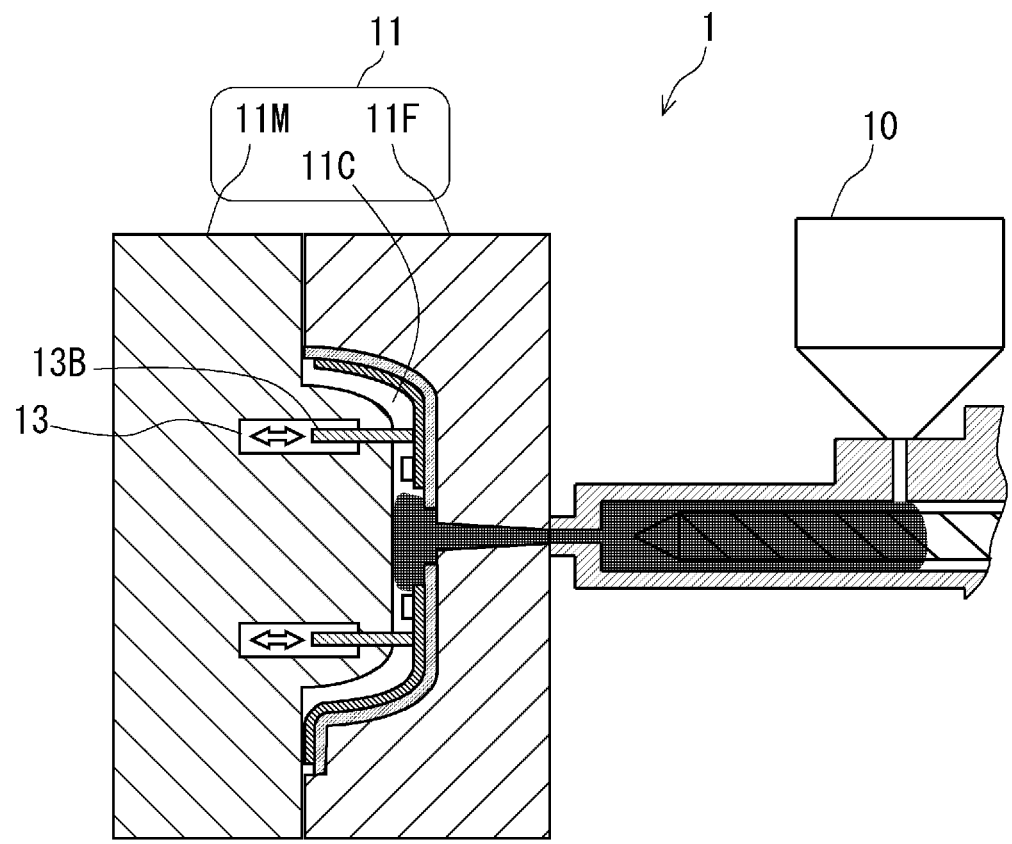
FIG. 10 is a diagram showing a third example of the molding system.

Next, yet another implementation of the substrate holding device is described with reference to FIG. 10. FIG. 10 is a diagram showing a third example of the molding system. The mold 11 shown in the drawing is different from the molding system shown in FIG. 9 in that the movable mold 11M includes the clamping device 13. In addition, the pins of the clamping device 13 are different from the molding system shown in FIG. 9 in also serving as ejector pins.

The clamping device 13 is configured in such a manner that a plurality of pins 13B buried in the movable mold 11M is able to protrude in the resin filling space 11C. The clamping device 13 includes an actuator (not shown) to make the pins 13B protrude from the movable mold 11M or to house the protruding pins. The clamping device 13 makes the pins 13B protrude to clamp the flexible substrate 120 with the pins 13B and the stationary mold 11F. Accordingly, the molding system 1 holds the flexible substrate 120.

FIG. 10 shows that the mold 11 is being closed and that the clamping device 13 is clamping the flexible substrate 120. FIG. 10 further shows that the injection molding apparatus 10 is injecting resin while the clamping device 13 is clamping the flexible substrate 120. Here, the clamping device 13 releases the clamping after filling the resin filling space 11C with resin is started and before the filling is completed. Note that, the flexible substrate at the gate portion in FIG. 10 has a hole for not blocking the flow of resin. By employing such a structure, the molding system 1 can inject resin from, for example, a pin gate. However, if such a structure with a hole is not employed for a molding, resin may be injected from a side gate. In addition, the molding system 1 may employ another method using a film gate, a submarine gate, or the like in order for the flexible substrate 120 not to block injection of resin.

After releasing the clamping, the pins 13B retract from the resin filling space 11C. Then, filling the resin filling space 11C with resin is completed, and the resin with which the resin filling space 11C is filled is solidified. Then, the molding system 1 separates the movable mold 11M from the stationary mold 11F. At that time, the pins 13B function as ejector pins that separate the solidified resin (molding) from the movable mold 11M. With such motions, the clamping device 13 holds the flexible substrate 120 and houses the pins 13B before the resin filling space 11C is completely filled with resin. In addition, the pins 13B function as the ejector pins at the time of mold release.

The implementations of the substrate holding device have been described. As described above, in the molding system 1, the flexible substrate 120 can be fixed in the resin filling space 11C along the stationary mold 11F or along the movable mold 11M. In addition, the clamping device 13 may be also provided in the movable mold 11M at the positions corresponding to the pins 13A protruding from the stationary mold 11F. With such a configuration, the molding system 1 can clamp the flexible substrate 120 in the hollow of the resin filling space 11C without bringing the flexible substrate 120 into close contact with the mold 11. Note that, the examples shown in FIGS. 9 and 10 each may have a separate mechanism that holds flexible substrate when the mold 11 is opened.

Figure 11:
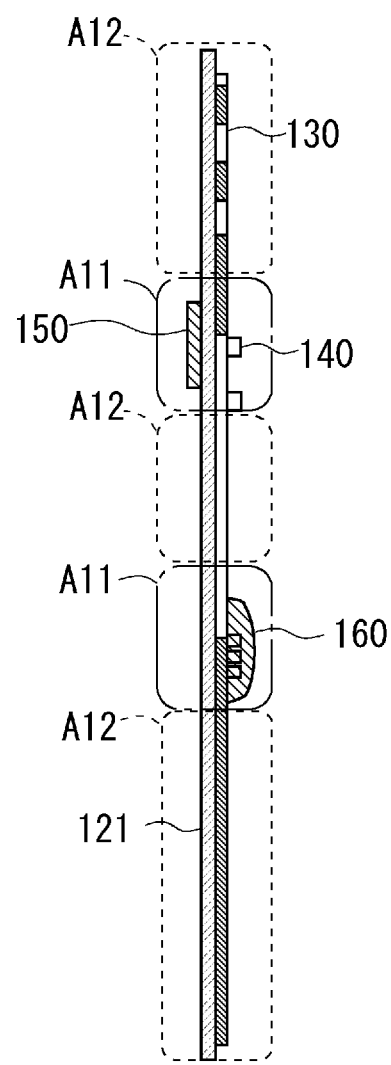
FIG. 11 is a cross-sectional view of a flexible substrate according to a modified example of the embodiment.

Next, a modified example of the flexible substrate 120 is described with reference to FIG. 11. FIG. 11 is a cross-sectional view of a flexible substrate according to a modified example of the embodiment. The flexible substrate 120 shown in FIG. 11 is a cross-sectional view of the flexible substrate 120 shown in FIG. 3 to which a reinforcing plate 150 and reinforcing agent 160 are added. The flexible substrate 120 shown in the drawing is separable into a first area A11 and a second area A12. In the first area A11, the electronic component 140 is mounted on the wiring portion 130.

In the flexible substrate 120 shown in FIG. 11, the reinforcing plate 150 is provided on the face of the base film 121 opposed to the face on which the wiring portion 130 is mounted. The reinforcing plate 150 is stuck to the base film 121 with pressure sensitive adhesive or glue. The reinforcing plate 150 shown in FIG. 11 is stuck to the face opposed to the face on which the electronic component 140 is mounted. In this manner, by providing the reinforcing plate 150 in the first area A11, the flexible substrate 120 can relax mechanical loads applied to the mounting face of the electronic component 140 during deformation or injection molding.

In addition, the reinforcing agent 160 is added to the flexible substrate 120 shown in FIG. 11 in such a manner as to cover the electronic component 140. The reinforcing agent 160 is made of, for example, a material mainly containing thermosetting resin, such as epoxy resin. In this manner, by providing the reinforcing agent 160 in the first area A11, the flexible substrate 120 can relax mechanical loads applied to the mounting face of the electronic component 140 during deformation or injection molding. In addition, the reinforcing agent 160 reduces thermal loads applied to the electronic component 140.

Figure 12:
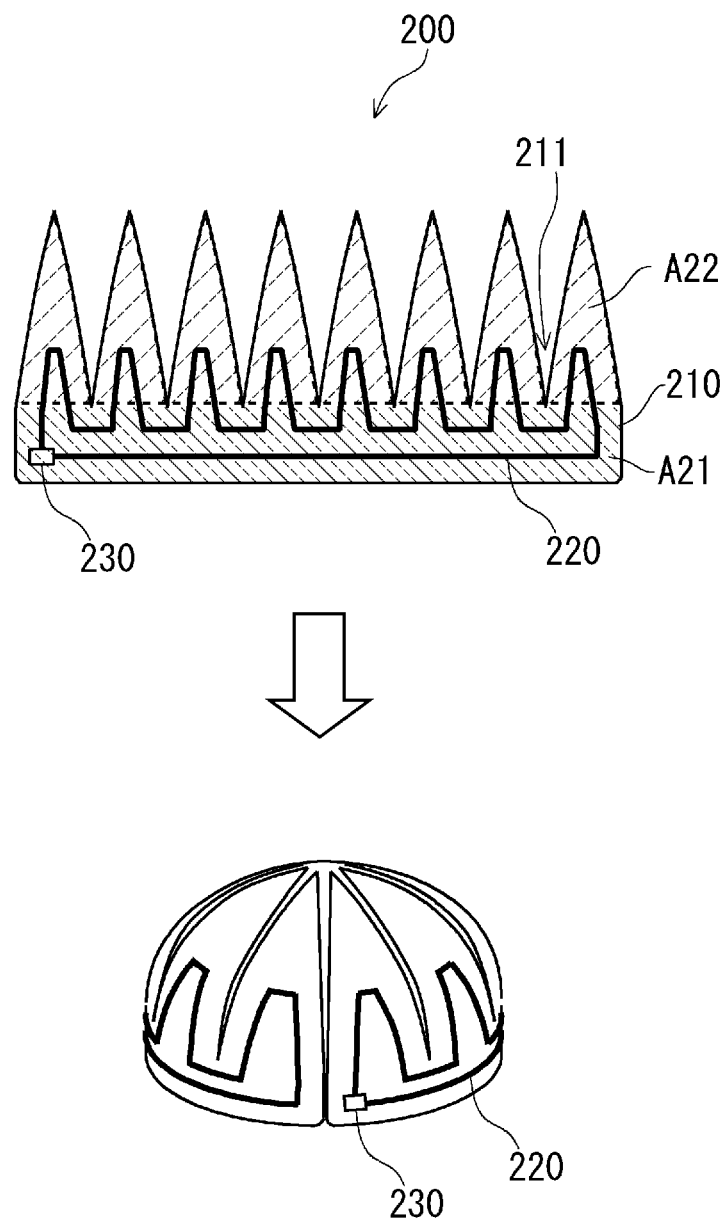
FIG. 12 is a first diagram showing a form of the flexible substrate.

Next, another modified example of the flexible substrate is described with reference to FIG. 12. FIG. 12 is a first diagram showing another example of the flexible substrate. The upper part of FIG. 12 shows a flexible substrate 200 as its unfolded shape. The lower part of FIG. 12 shows the flexible substrate 200 deformed into a three-dimensional shape.

As shown in the unfolded shape, the flexible substrate 200 has a shape in which eight isosceles triangles having the same shape are arranged on the upper side of a long rectangle extending in the horizontal direction. Then, in each space between the adjacent isosceles triangles, a V-shaped notch portion 211 is provided.

In the flexible substrate 200, the rectangular portion is set as a first area A21, and the triangular portions are set as a second area A22. In addition, the flexible substrate 200 includes a wiring portion 220 over the first area A21 and the second area A22 and an electronic component 230 on the wiring portion 220 in the first area A21.

The flexible substrate 200 having such an unfolded shape can be deformed into a semispherical shape as shown in the lower part of FIG. 12. At this time, the notch portion 211 is deformed to have a more acute angle. With such a structure, the flexible substrate 200 can form the three-dimensional shape. In addition, by using a mold corresponding to such a three-dimensional shape and performing integral molding by the above molding method, the user can integrally mold a flexible substrate and thermoplastic resin to form the three-dimensional shape.

Figure 13:
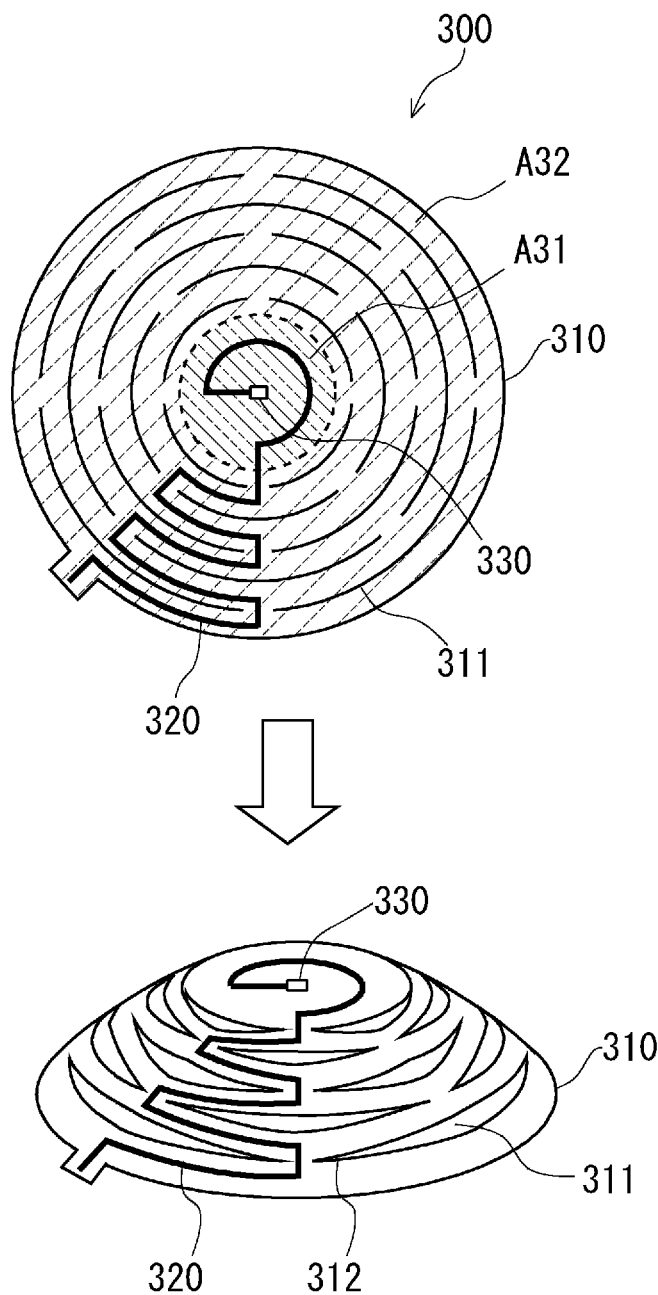
FIG. 13 is a second diagram showing a form of the flexible substrate.

Next, another modified example of the flexible substrate is described with reference to FIG. 13. FIG. 13 is a second diagram showing another example of the flexible substrate. The upper part of FIG. 13 shows a flexible substrate 300 as its unfolded shape. The lower part of FIG. 13 shows the flexible substrate 300 deformed into a three-dimensional shape.

As shown in the unfolded shape, the flexible substrate 300 is provided with a plurality of circular-arc slit portions 311 in a disk-shaped base film 310. However, the center portion of the base film 310 has an area in which no slit portion 311 is provided.

In the flexible substrate 300, the center portion is set as a first area A31, and the other portions are set as a second area A32. In addition, the flexible substrate 300 includes a wiring portion 320 over the first area A31 and the second area A32. The wiring portion 320 is laid from the outermost circumferential portion of the base film 310 to the center in a crank-like shape in such a manner as not to interfere the slit portions 311. The flexible substrate 300 further includes an electronic component 330 on the wiring portion 320 in the first area A31 in the center portion.

The flexible substrate 300 having such an unfolded shape can be deformed into a truncated conical shape as shown in the lower part of FIG. 13. At this time, the slit portions 311 are expanded and deformed into notch portions 312. With such a structure, the flexible substrate 300 can form the three-dimensional shape. In addition, by using a mold corresponding to such a three-dimensional shape and performing integrate molding by the above molding method, the user can integrally mold a flexible substrate and thermoplastic resin to form the three-dimensional shape.

Figure 14:
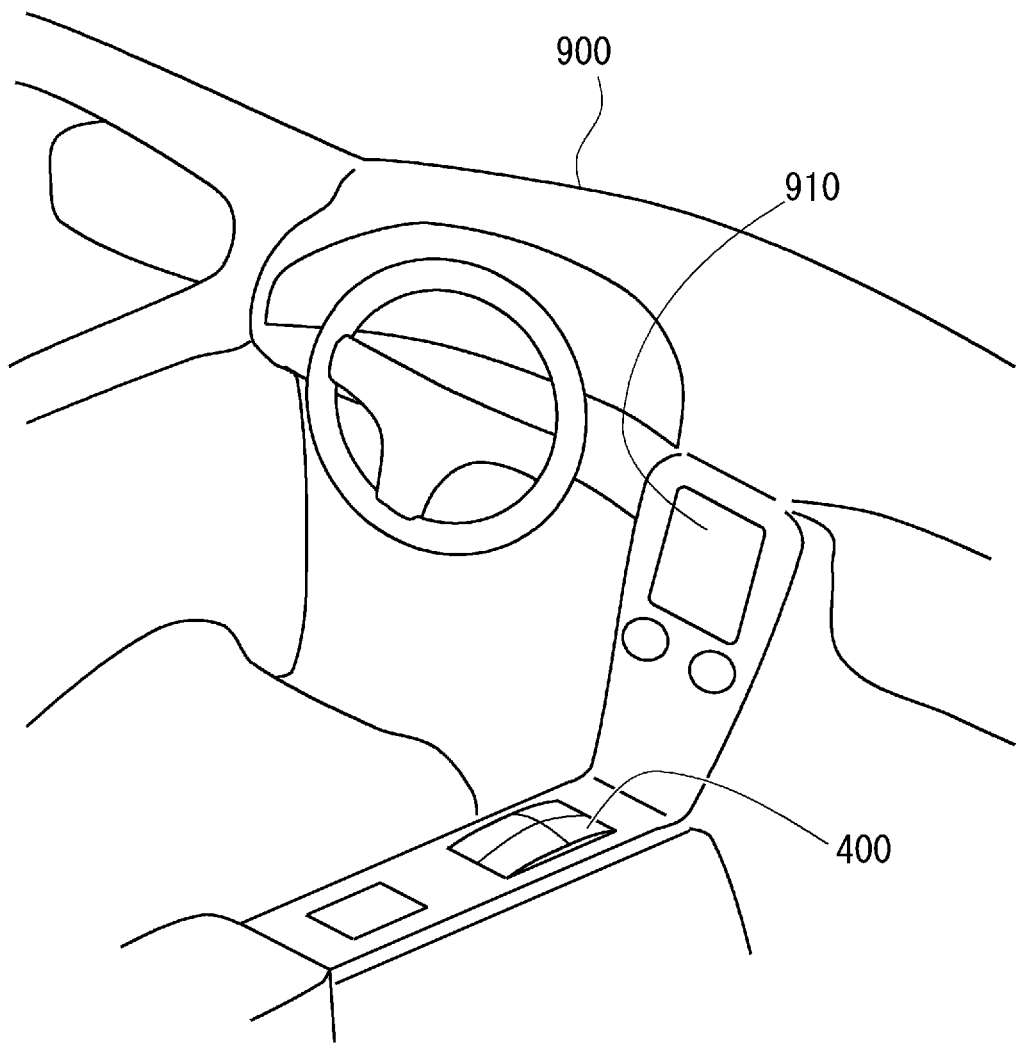
FIG. 14 is a diagram showing an example of an input device installed in an automobile.

Next, an application example of a molding manufactured by the molding method according to the present embodiment is described with reference to FIGS. 14, 15, and 16. FIG. 14 is a diagram showing an example of an input device mounted in an automobile.

FIG. 14 shows a center console of an automobile 900. The center console includes a display 910 and an input device 400. The display 910 displays various types of information, such as map data and audio information.

The input device 400 is used to control items to be displayed on the display 910 and is, for example, an electrostatic capacitive touch sensor. The input device 400 has a smoothly-protruding shape in order for a driver to put his/her palm thereon to operate it. The surface of the input device 400 is covered with resin, and an integrally-molded flexible substrate is under the surface resin. Note that, the input device 400 is shown to describe a concrete example of the present embodiment, and the description of the function of the input device 400 itself is omitted.

Figure 15:
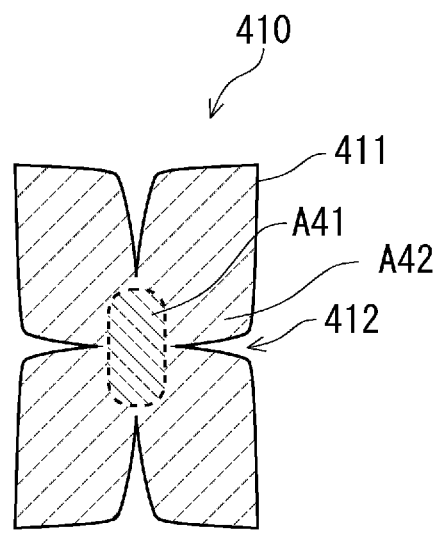
FIG. 15 is a diagram showing a first example of a flexible substrate used for the input device.
Figure 15:
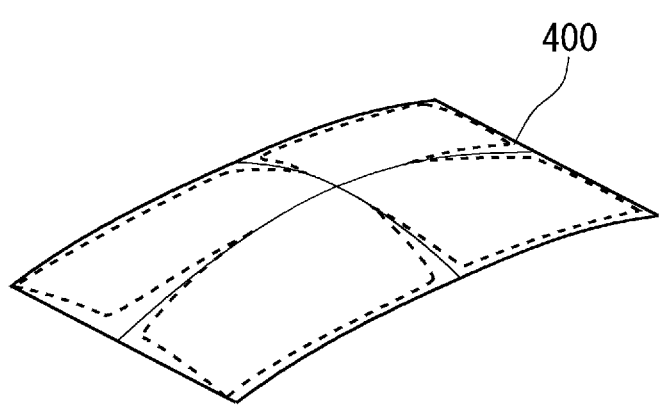

FIG. 15 is a diagram showing a first example of the shape of a flexible substrate to be applied to the input device 400. The upper part of FIG. 15 shows a flexible substrate 410 as its unfolded shape. The lower part of FIG. 15 shows the input device 400 that is integrally molded with the flexible substrate 410 deformed into a three-dimensional shape.

As shown in the unfolded shape, in the flexible substrate 410, four notch portions 412 are provided from the center portions of the four sides of a rectangular base film 411 toward the center of the rectangle.

In the flexible substrate 410, a center portion is set as a first area A41, and the other portions are set as a second area A42. The flexible substrate 410 can include a wiring portion over the first area A41 and the second area A42. In addition, the flexible substrate 410 can be mounted with an electronic component 330 in the first area A41 at the center portion.

The flexible substrate 410 having such an unfolded shape can be deformed into a three-dimensional shape having a smoothly protruding shape as shown in the lower part of FIG. 15. At this time, the notch portions 412 are each deformed to have a more acute angle.

In this manner, the flexible substrate 410 can form the three-dimensional shape. In addition, by using a mold corresponding to such a three-dimensional shape, the user can manufacture the input device 400 by the above molding method by integral molding.

Figure 16:
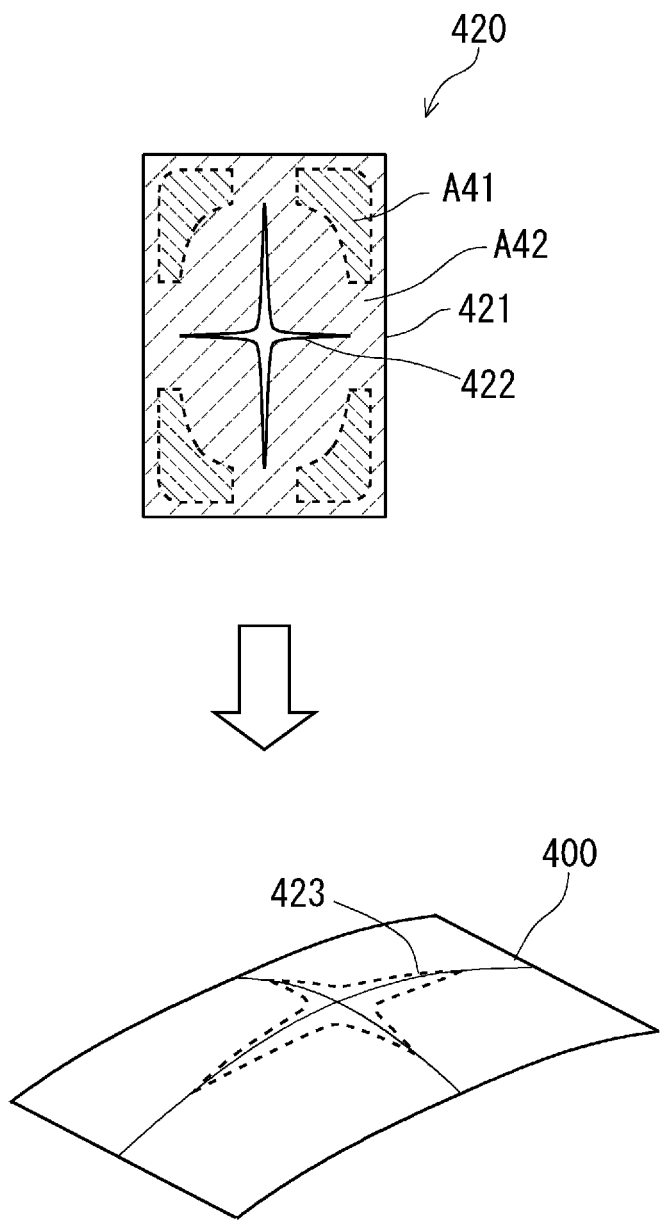
FIG. 16 is a diagram showing a second example of the flexible substrate used for the input device.

FIG. 16 is a diagram showing a second example of the shape of a flexible substrate to be applied to the input device 400. The upper part of FIG. 16 shows a flexible substrate 420 as its unfolded shape. The lower part of FIG. 16 shows the input device 400 integrally molded with the flexible substrate 420 deformed into a three-dimensional shape.

As shown in the unfolded shape, in the flexible substrate 420, a slit portion 422 formed in a rectangular base film 421 in such a manner as to be extended from the center portion to each side of the rectangle is provided.

In the flexible substrate 420, four corner peripheral portions are set as a first area A41, and the other portions are set as a second area A42. The flexible substrate 420 can include a wiring portion over the first area A41 and the second area A42. In addition, the flexible substrate 420 can be mounted with an electronic component 330 in the first area A41 set to the four corner portions.

The flexible substrate 420 having such an unfolded shape can be deformed into a three-dimensional shape having a smoothly-protruding shape shown in the lower part of FIG. 16. At this time, the slit portion 422 is expanded and deformed into a notch portion 423.

In this manner, the flexible substrate 420 can form the three-dimensional shape. In addition, by using a mold corresponding to such a three-dimensional shape, the user can manufacture the input device 400 by the above molding method by integrate molding. Note that, the flexible substrates described with FIGS. 14 to 16 are merely examples and do not limit a specific shape of the flexible substrate. Various shapes of the flexible substrate can be employed within a range conceivable by those skilled in the art.

The embodiment has been described above, but the molding method and the molding system according to the embodiment are not limited to the above description. The flexible substrate may have circuits on both faces of the base film. In addition, if having the circuits on both faces, the flexible substrate may further include a through hole connecting the circuits on both faces. Furthermore, the flexible substrate may be a multilayered substrate.

The injection molding apparatus may be, for example, an injection molding apparatus using a die slide injection method. If the injection molding apparatus using the die slide injection method is employed, the injection molding apparatus may perform the step of holding the flexible substrate with the primary side and perform the step of integrally molding the flexible substrate with the secondary side. By employing such steps, the molding method according to the embodiment can improve the work efficiency.

As described above, the molding method according to the embodiment can selectively suppress the stress generated at an electronic component and a wiring portion of a flexible substrate and integrally mold the flexible substrate and resin with simple steps. Thus, according to the embodiment, it is possible to provide an insert molding method and a molding system that integrally mold resin and a flexible substrate including an electronic component into a three-dimensional shape.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A molding method of integrally molding thermoplastic resin and a flexible substrate mounted with a circuit and an electronic component on a flat plate having flexibility to form a three-dimensional shape, with the electronic component being mounted on the circuit, the molding method comprising the steps of:
   (a) preparing the flexible substrate, having the mounted circuit and electronic component, with an unfolded shape corresponding to the three-dimensional shape;
   (b) inserting the flexible substrate in the unfolded shape into an open mold and, while the mold is open, elastically deforming the flexible substrate from the unfolded shape into the three-dimensional shape and holding the flexible substrate in the three-dimensional shape along the mold; and
   (c) closing the mold and filling a resin filling space of the mold with thermoplastic resin such that the flexible substrate in the three-dimensional shape becomes non-releasably integrated with the molded thermoplastic resin,
   wherein the step (c) includes clamping the flexible substrate against a surface of a first part of the mold using clamping members that are protruded from a surface of a second part of the mold, the clamping members including a plurality of pins that are protruded into the resin filling space.

2. The molding method according to claim 1, wherein the three-dimensional shape has a portion formed as a curved surface that conforms to a curved surface of the first part of the mold, and the step (a) includes providing a notch portion to the flat plate as part of the unfolded shape.

3. The molding method according to claim 1, wherein the three-dimensional shape has a portion formed as a curved surface that conforms to a curved surface of the first part of the mold, and the step (a) includes providing a slit to the flat plate in such a manner that the three-dimensional shape includes a notch portion.

4. The molding method according to claim 1, wherein the step (a) includes, in arranging of the circuit, setting an area in the flexible substrate to be elastically deformed in the step (b) and the step (c) having a curvature radius equal to or greater than a preset curvature radius as a first area, setting an area having a curvature radius less than the preset curvature radius as a second area, and arranging the electronic component in the first area.

5. The molding method according to claim 1, wherein the step (a) includes, in arranging of the circuit, setting an area in which the flexible substrate receives stress of less than a preset threshold in the step (b) and the step (c) as a first area, setting an area in which the flexible substrate receives stress of equal to or greater than the threshold as a second area, and arranging the electronic component in the first area.

6. The molding method according to claim 4, wherein the step (a) includes adding a reinforcing member to the first area to improve rigidity.

7. The molding method according to claim 1, wherein the step (c) includes releasing the holding of the flexible substrate in the filling.

8. The molding method according to claim 1, wherein the step (a) includes providing notches between adjacent portions of the flexible substrate.

9. The molding method according to claim 1, wherein the step (a) includes providing the flexible substrate with slits configured to expand and deform during the step (b).

10. The molding method according to claim 1, wherein the step (a) includes providing the flexible substrate with at least one of a reinforcing plate portion disposed opposite the electronic component and a reinforcing agent covering the electronic component.

11. The molding method according to claim 1, wherein the clamping is released after the filling of the resin filling space is started and before the filling of the resin filling space is completed.

12. The molding method according to claim 11, wherein the first part of the mold is a fixed mold part, the second part of the mold is a movable mold part, and the clamping members include pins that are used as ejector pins to separate the molded thermoplastic resin from the movable mold part when the movable mold part is separated from the fixed mold part after the step (c).

13. The molding method according to claim 11, wherein
the surface of the first part of the mold against which the substrate is clamped has a concave configuration facing the second part of the mold, the second part of the mold includes a portion having a convex configuration facing the surface of the first part of the mold,
the clamping members include pins that are protruded from the portion of the second part of the mold having the convex configuration in the step (c),
the first part of the mold is a fixed mold part, and the second part of the mold is a movable mold part, and
the pins are used as ejector pins to separate the molded thermoplastic resin from the movable mold part when the movable mold part is separated from the fixed mold part after the step (c).

14. The molding method according to claim 1, wherein
the pins are operated by an actuator configured to move the pins between a first state in which the pins protrude from the surface of the second part of the mold and a second state in which the pins are housed in the second part of the mold,
the actuator moving the pins to the first state when the resin is filled in the resin filling space, and
the actuator moving the pins to the second state before the filling is completed.

15. The molding method according to claim 1, wherein the mold is provided with a substrate holding device having a suction device configured to suck air through a hole provided on a face exposed to the resin filling space of the mold, and the step (b) includes inserting the flexible substrate into the mold in such a manner as to cover the hole, and using the substrate holding device to hold the flexible substrate by suction.

* * * * *